United States Patent
Kaida

(10) Patent No.: US 11,977,100 B2
(45) Date of Patent: May 7, 2024

(54) INSPECTION JIG

(71) Applicant: NIDEC READ CORPORATION, Kyoto (JP)

(72) Inventor: Michio Kaida, Kyoto (JP)

(73) Assignee: NIDEC READ CORPORATION, Muko (JP)

( * ) Notice: Subject to any disclaimer, the term of this patent is extended or adjusted under 35 U.S.C. 154(b) by 214 days.

(21) Appl. No.: 17/432,114

(22) PCT Filed: Feb. 20, 2020

(86) PCT No.: PCT/JP2020/006673
§ 371 (c)(1),
(2) Date: Aug. 19, 2021

(87) PCT Pub. No.: WO2020/171151
PCT Pub. Date: Aug. 27, 2020

(65) Prior Publication Data
US 2022/0137094 A1    May 5, 2022

(30) Foreign Application Priority Data

Feb. 22, 2019   (JP) ................. 2019-031002

(51) Int. Cl.
   *G01R 31/20*     (2006.01)
   *G01R 1/073*    (2006.01)
(52) U.S. Cl.
   CPC ................. *G01R 1/07342* (2013.01)

(58) Field of Classification Search
   CPC ............ G01R 1/06722; G01R 1/07342; G01R 1/07378; G01R 1/07314; G01R 1/07328;
   (Continued)

(56) References Cited

U.S. PATENT DOCUMENTS 6,407,565 B1 *   6/2002   Sayre ................. G01R 1/07328
                                              324/763.01
10,649,004 B2    5/2020   Ota
(Continued)

FOREIGN PATENT DOCUMENTS

JP            817500 A     1/1996
JP        2005172603 A     6/2005
(Continued)

*Primary Examiner* — Thang X Le
(74) *Attorney, Agent, or Firm* — VIERING, JENTSCHURA & PARTNER MBB

(57) ABSTRACT

An inspection jig includes contact terminals and a pitch conversion unit electrically connected to the contact terminals and configured to convert a first pitch between adjacent two of the contact terminals into a second pitch different from the first pitch. The contact terminals each include a tubular body that extends in an axial direction of the contact terminal and is electrically conductive, and a conductor that is electrically conductive and has a stick shape. The tubular body includes a spring portion that has a helical shape along a peripheral surface of the tubular body. The conductor includes an uninserted portion that protrudes from the tubular body toward a first side in the axial direction, and an inserted portion that is disposed in the tubular body and is fixed to a first axial end portion of the tubular body. The pitch conversion unit includes a board portion and a protruding portion.

20 Claims, 10 Drawing Sheets

(58) Field of Classification Search
CPC ............ G01R 31/2889; G01R 31/2886; G01R 31/2808; G01R 31/2601
See application file for complete search history.

(56) References Cited

U.S. PATENT DOCUMENTS

| | | |
|---|---|---|
| 10,649,005 B2 | 5/2020 | Ota |
| 10,775,411 B2 * | 9/2020 | Yoshioka ............ G01R 1/07371 |
| 2007/0075726 A1 * | 4/2007 | Chan ................. G01R 1/07378 |
| | | 324/762.01 |
| 2008/0042676 A1 * | 2/2008 | Yamada ............. G01R 1/07314 |
| | | 324/755.05 |
| 2019/0302170 A1 * | 10/2019 | Kanai .................... G01R 31/26 |
| 2019/0346485 A1 * | 11/2019 | Ota .................... G01R 1/06722 |

FOREIGN PATENT DOCUMENTS

| | | |
|---|---|---|
| JP | 2008170255 A | 7/2008 |
| JP | 2008256362 A | 10/2008 |
| TW | 201734490 A | 10/2017 |
| WO | 2011115082 A1 | 9/2011 |

* cited by examiner

INSPECTION JIG

CROSS-REFERENCE TO RELATED APPLICATIONS

This is the U.S. national stage of application No. PCT/JP2020/006673, filed on Feb. 20, 2020, and further claims priority under 35 U.S.C. § 119(a) and 35 U.S.C. § 365(b) from Japanese Patent Application No. 2019-031002, filed on Feb. 22, 2019; the disclosures of which are incorporated herein by reference in their entirety.

FIELD

The present disclosure relates to an inspection jig for inspecting an inspection target.

BACKGROUND

There is known an inspection jig that includes a contact terminal to be brought into contact with an inspection target.

A conventional contact terminal includes a tubular body, a first central conductor, and a second central conductor. The tubular body is made of an electrically conductive material and is formed into a tubular shape. The tubular body includes a first spring portion and a second spring portion each configured to expand and contract in an axial direction of the tubular body. The tubular body has, at its axial center, a joining portion configured to join the first spring portion and the second spring portion to each other.

Each of the first central conductor and the second central conductor is made of an electrically conductive material and is formed into a stick shape. The first central conductor has, at its distal end, a first swell portion. The first swell portion is disposed in the joining portion with the first central conductor fixed to a first end portion of the tubular body. The second central conductor has, at its distal end, a second swell portion. The second swell portion is disposed in the joining portion with the second central conductor fixed to a second end portion of the tubular body.

When a base plate is attached to a support member that supports the contact terminal having the configuration described above, a first end portion of the first central conductor is pressed against an electrode of the base plate in accordance with a biasing force of the first spring portion and a biasing force of the second spring portion, so that the first end portion of the first central conductor and the electrode are held in an electrically conductive and contact state.

In inspecting an inspection target with the contact terminal, a second end portion of the second central conductor is pressed against an inspection point to be inspected on the inspection target, in accordance with the biasing force of the first spring portion and the biasing force of the second spring portion, so that the second end portion of the second central conductor and the inspection point to be inspected are held in an electrically conductive and contact state.

With this configuration, the contact of the inspection target with the second end portion of the second central conductor, the contact of the second swell portion with the joining portion, the contact of the joining portion with the first swell portion, and the contact of the first end portion of the first central conductor with the electrode respectively form contact points, so that a current path is formed.

According to the inspection jig, however, the number of contact points on the current path is four as described above, so that a contact resistance may increase an electrical resistance value of the current path.

SUMMARY

An exemplary inspection jig according to the present disclosure includes contact terminals and a pitch conversion unit electrically connected to the contact terminals and configured to convert a first pitch between adjacent two of the contact terminals into a second pitch different from the first pitch. The contact terminals each include a tubular body that extends in an axial direction of the contact terminal and is electrically conductive, and a conductor that is electrically conductive and has a stick shape. The tubular body includes a spring portion that has a helical shape along a peripheral surface of the tubular body. The conductor includes an uninserted portion that protrudes from the tubular body toward a first side in the axial direction, and an inserted portion that is disposed in the tubular body and is fixed to a first axial end portion of the tubular body. The pitch conversion unit includes a board portion that has a surface perpendicular to the axial direction, and a protruding portion that protrudes from the surface toward the first side in the axial direction, is electrically conductive, and is fitted to a second axial end portion of the tubular body.

The above and other elements, features, steps, characteristics and advantages of the present disclosure will become more apparent from the following detailed description of the preferred embodiments with reference to the attached drawings.

DETAILED DESCRIPTION

Figure 1:
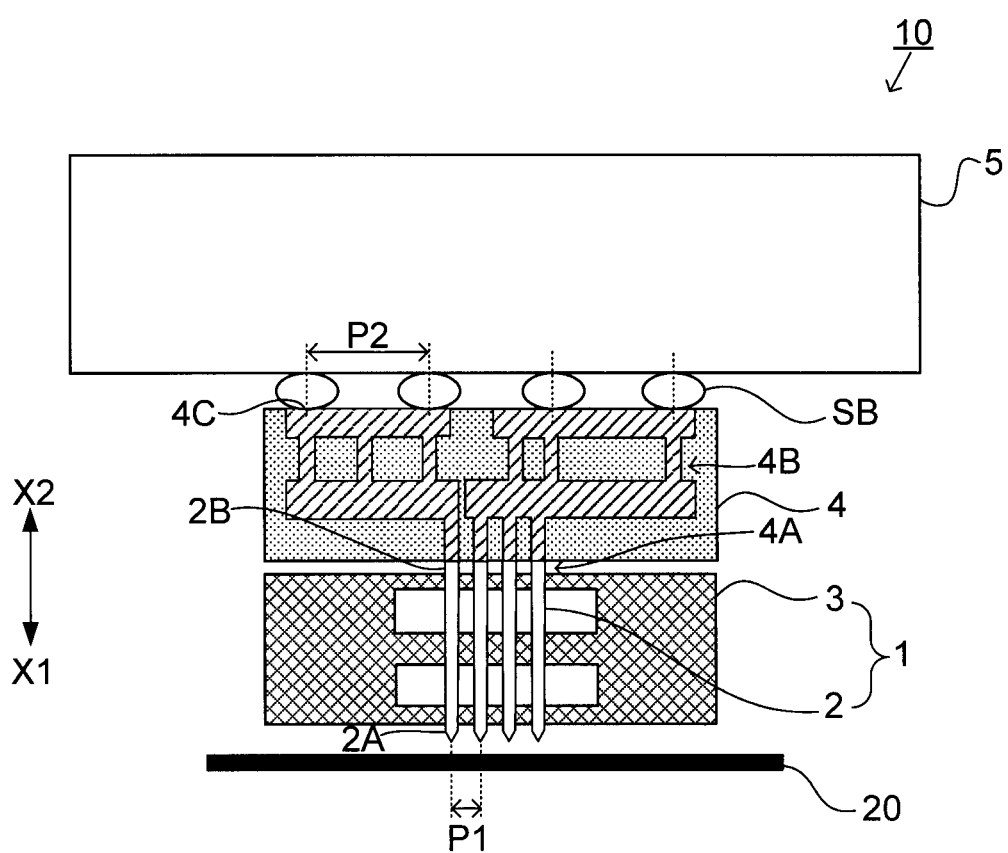
FIG. 1 is a schematic diagram that illustrates an overall configuration of an inspection jig according to an exemplary embodiment of the present disclosure.

Exemplary embodiments of the present disclosure will be described below with reference to the drawings. In the following, a direction parallel to a center axis of a contact terminal is defined as an "axial direction". In the drawings, "X1" represents a first side in the axial direction and "X2" represents a second side in the axial direction.

FIG. 1 is a schematic diagram that illustrates an overall configuration of an inspection jig according to an exemplary embodiment of the present disclosure. It should be noted in FIG. 1 that the first side X1 in the axial direction corresponds to a lower side and the second side X2 in the axial direction corresponds to an upper side.

An inspection jig 10 illustrated in FIG. 1 is used for an inspection apparatus configured to carry out an electrical inspection on an inspection target 20. The inspection jig 10 is, for example, a probe card.

The inspection target 20 is, for example, a semiconductor wafer including a semiconductor substrate such as a silicon substrate and a plurality of circuits formed on the semiconductor substrate. The semiconductor wafer is diced into semiconductor chips having the respective circuits. In addition to a semiconductor wafer, the inspection target 20 may also be a semiconductor chip, a chip size package (CSP), or an electronic component such as a semiconductor element.

The inspection target 20 may also be a board. In this case, the inspection target 20 may be, for example, a board such as a printed circuit board, a glass epoxy board, a flexible board, a ceramic multilayer circuit board, a package board for a semiconductor package, an interposer board, or a film carrier. The inspection target 20 may alternatively be an electrode plate for a display such as a liquid crystal display, an electro-luminescence (EL) display, or a touch screen display or an electrode plate for a touch screen.

The inspection target 20 may alternatively be a product obtained by packaging technology called embedded multi-die interconnect bridge (EMIB). According to EMIB, a small silicon substrate called a silicon bridge is embedded in a package resin board, and fine wires are formed on a surface of the silicon bridge in high density, so that adjacent silicon dies are mounted on the package resin board in proximity to each other.

As illustrated in FIG. 1, the inspection jig 10 includes a probe head 1, a pitch conversion unit 4, and a printed circuit board (PCB) 5. The probe head 1 includes contact terminals (probes) 2 and a support member 3.

The support member 3 supports the contact terminals 2 each having a stick shape. The pitch conversion unit 4 is disposed above the support member 3 and is fixed to the support member 3. For example, the support member 3 is fixed to the pitch conversion unit 4 with a spacer (not illustrated) between the pitch conversion unit 4 and the support member 3. The contact terminals 2 each have a first end portion 2A on the first side X1 in the axial direction and a second end portion 2B on the second side X2 in the axial direction. The second end portion 2B is electrically connected to a lower end portion 4A of the pitch conversion unit 4. The details of an electrical connection configuration in the lower end portion 4A will be described later.

The lower end portion 4A is brought into electrical conduction with electrodes 4C formed on an upper surface of the pitch conversion unit 4, via wiring portions 4B formed in the pitch conversion unit 4. The pitch conversion unit 4 converts a first pitch P1 between adjacent two of the contact terminals 2 into a second pitch P2 between adjacent two of the electrodes 4C. The second pitch P2 is larger than the first pitch P1.

In other words, the inspection jig 10 includes the contact terminals 2 and the pitch conversion unit 4 electrically connected to the contact terminals 2 and configured to convert the first pitch P1 between adjacent two of the contact terminals 2 into the second pitch P2 different from the first pitch P1.

The PCB 5 is electrically connected to the electrodes 4C with solder balls SB. The PCB 5 is electrically connected to an inspection processing portion (not illustrated) with a cable, a connection terminal, or the like (not illustrated).

In a case where the inspection target 20 is, for example, a semiconductor wafer, inspection points such as pads or bumps are formed for each circuit corresponding to an individual semiconductor chip to be obtained by dicing the inspection target 20. The inspection apparatus defines a certain region of the circuits on the inspection target 20 as an inspection region, and moves the inspection jig 10 to a position at which the contact terminals 2 located above are opposite the inspection points located below in the inspection region. At this time, the first end portions 2A of the contact terminals 2 of the inspection jig 10 are directed toward the inspection target 20.

The inspection apparatus carries out an energization inspection by moving the inspection jig 10 downward to bring the contact terminals 2 into contact with the inspection points in the inspection region and feeding current to the inspection target 20 via the contact terminals 2.

After completion of the inspection on the inspection region in the inspection target 20, the inspection apparatus carries out an inspection by moving the inspection jig 10 upward, moving the inspection jig 10 parallel to a position corresponding to a new inspection region, and moving the inspection jig 10 downward to bring the contact terminals 2 into contact with the inspection points in the new inspection region. As described above, the inspection apparatus inspects the entire inspection target 20 while changing the inspection regions in sequence.

Alternatively, the inspection jig 10 may be fixed, while the inspection target 20 may be moved to the inspection jig 10.

Figure 2:
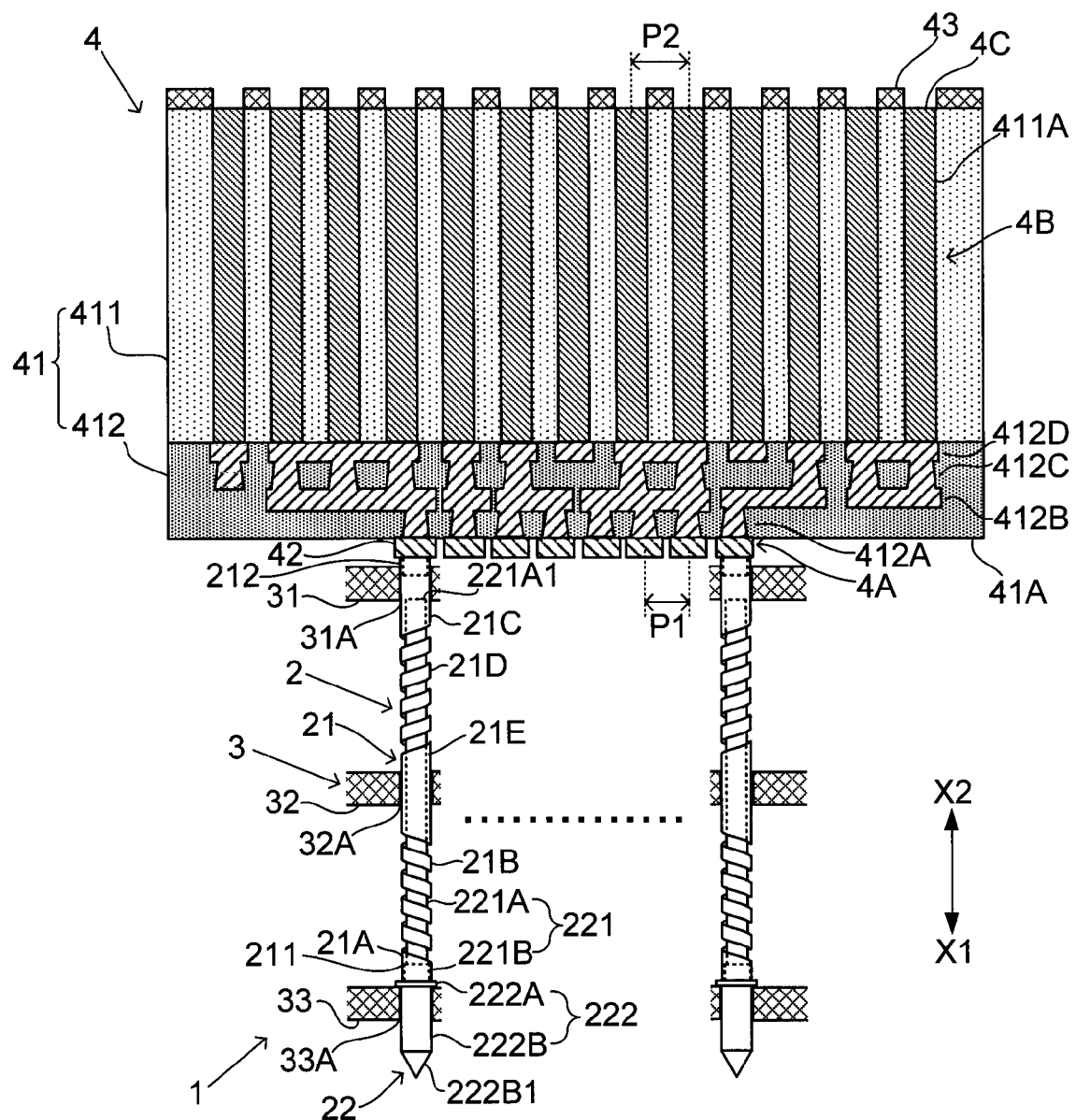
FIG. 2 is a longitudinal sectional view that illustrates a specific configuration example of a probe head and a pitch conversion unit.

FIG. 2 is a longitudinal sectional view that illustrates a more specific configuration example of the probe head 1 and the pitch conversion unit 4. It should be noted in FIG. 2 that the contact terminals 2 are not illustrated in the form of a sectional view for convenience.

As illustrated in FIG. 2, the contact terminals 2 each include a tubular body 21 that extends in the axial direction and is electrically conductive, and a conductor (a plunger) 22 that is electrically conductive and has a stick shape.

The tubular body 21 has, for example, a cylindrical shape. The tubular body 21 is, for example, a nickel or nickel-alloy tube having an outside diameter of about 25 to 300 μm and an inside diameter of about 10 to 250 μm. Preferably, the tubular body 21 has, on its inner peripheral surface, a plating layer such as a gold plating layer. In addition, the tubular body 21 may have an outer peripheral surface coated with an insulating coating as necessary.

The tubular body 21 includes, as a first axial end portion 211, a first body portion 21A for fixing the conductor 22 as will be described later. The tubular body 21 includes a first spring portion 21B that is contiguous with the first body portion 21A on the second side X2 in the axial direction. The tubular body 21 includes, as a second axial end portion 212, a second body portion 21C to be fitted to a protruding portion 42 (to be described later). The tubular body 21 includes a second spring portion 21D that is contiguous with the second body portion 21C on the first side X1 in the axial direction. The tubular body 21 includes a third body portion 21E joining the first spring portion 21B and the second spring portion 21D together.

Each of the first spring portion 21B and the second spring portion 21D is formed as a helical body that extends helically along a peripheral surface of the tubular body 21. In other words, the tubular body 21 includes the spring portions 21B and 21D each having a helical shape along the peripheral surface of the tubular body 21. The spring portions include the first spring portion 21B and the second spring portion 21D disposed on the first spring portion 21B on the second side X2 in the axial direction.

The first spring portion 21B and the second spring portion 21D are wound in opposite directions. The first spring portion 21B and the second spring portion 21D are wound by the same number. The first spring portion 21B and the second spring portion 21D may be wound in the same direction and may be wound by the different numbers.

In producing a tubular body having such a helical shape, for example, a gold plating layer is formed by plating on an outer periphery of a core material, and then a Ni electroforming layer is formed by electroforming on an outer periphery of the gold plating layer thus formed. Next, a resist layer is formed on an outer periphery of the Ni electroforming layer, and then is exposed with a laser, so that the resist layer is partially removed in a helical shape. Next, etching is performed with the resist layer as a masking material to remove the Ni electroforming layer at the position of the resist layer removed in the helical shape, and then the resist layer is removed. Next, the gold plating layer is removed at the position from which the Ni electroforming layer is removed in the helical shape, and the core material is removed with the gold plating layer left in an inner periphery of the Ni electroforming layer. The tubular body is thus produced.

The first body portion 21A, the second body portion 21C, and the third body portion 21E each have a tubular shape provided with no helical groove. In other words, the tubular body 21 includes the third body portion 21E that is disposed between the first spring portion 21B and the second spring portion 21D and has no helical groove, and the second body portion 21C that is disposed on the second axial end portion 212 of the tubular body 21 and has no helical groove.

The shape of the tubular body 21 is not limited to the cylindrical shape. For example, the tubular body 21 may have a polygonal annular tubular shape such as a quadrilateral annular tubular shape or a hexagonal annular tubular shape as seen in sectional view in the axial direction.

The contact terminals 2 each include an inserted portion 221 and an uninserted portion 222. The inserted portion 221 includes a stick-shaped main body portion 221A and a press-fitting portion 221B contiguous with the stick-shaped main body portion 221A on the first side X1 in the axial direction. The stick-shaped main body portion 221A has a columnar shape whose diameter is fixed in the axial direction. The press-fitting portion 221B is larger in outside diameter than the stick-shaped main body portion 221A. In a case where the tubular body 21 has a polygonal annular tubular shape as seen in sectional view in the axial direction as described above, the stick-shaped main body portion 221A has a prism shape, and the press-fitting portion 221B has a polygonal shape as seen in sectional view in the axial direction such that the press-fitting portion 221B is larger in area than the stick-shaped main body portion 221A as seen in sectional view in the axial direction.

The uninserted portion 222 includes a flange portion 222A and a contact portion 222B. The flange portion 222A is contiguous with the press-fitting portion 221B on the first side X1 in the axial direction. The contact portion 222B is contiguous with the flange portion 222A on the first side X1 in the axial direction.

Figure 3:
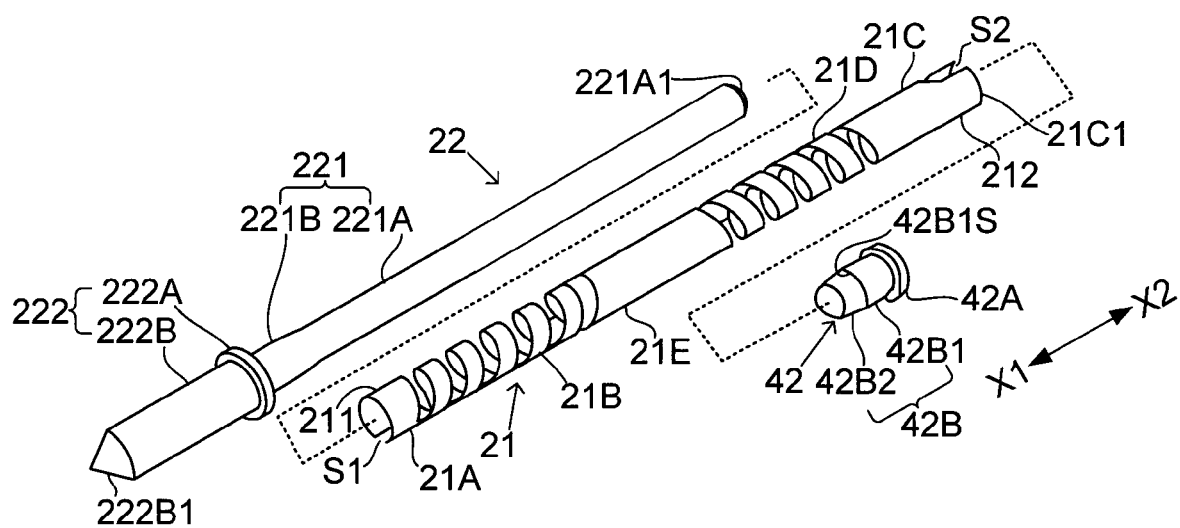
FIG. 3 is an exploded perspective view that illustrates a configuration in a case where a tubular body is fixed by press fitting to a protruding portion.

FIG. 3 is an exploded perspective view of the tubular body 21 and the conductor 22. As illustrated in FIG. 3, the first body portion 21A of the tubular body 21 has, in its peripheral surface, a slit S1 extending in the axial direction. The outside diameter of the press-fitting portion 221B is set to be larger than an inside diameter of the first body portion 21A in a state in which the stick-shaped main body portion 221A is not inserted in the tubular body 21. Therefore, in inserting the stick-shaped main body portion 221A into the tubular body 21 to mount the conductor 22 to the tubular body 21, the press-fitting portion 221B is press fitted to the first body portion 21A that is enlarged.

The inserted portion 221 is thus disposed in the tubular body 21 and is fixed to the first axial end portion 211 of the tubular body 21. In this state, the flange portion 222A is brought into contact with the first axial end portion 211 of the tubular body 21. Therefore, the flange portion 222A and the contact portion 222B each protrude from the tubular body 21 toward the first side X1 in the axial direction. In other words, the uninserted portion 222 protrudes from the tubular body 21 toward the first side X1 in the axial direction.

Referring back to FIG. 2, the contact portion 222B includes a distal end portion 222B1 to be brought into contact with an inspection point on the inspection target 20. In the example of FIG. 2, the distal end portion 222B1 has a conical shape. In addition to the conical shape, the distal end portion 222B1 may have a truncated cone shape, a hemispherical shape, a planar shape, or the like.

In the state in which the conductor 22 is mounted to the tubular body 21 as described above, a second axial end portion 221A1 of the stick-shaped main body portion 221A is located in the second body portion 21C. A difference between the outside diameter of the stick-shaped main body portion 221A and the inside diameter of the tubular body 21 is set to be small. With this configuration, in carrying out an inspection with the distal end portion 222B1 brought into contact with the inspection point on the inspection target 20, the first spring portion 21B and the second spring portion 21D are compressed and deformed, so that the outer peripheral surface of the stick-shaped main body portion 221A is brought into contact with the inner peripheral surface of the second body portion 21C in a slidable manner and is brought into electrical conduction with the inner peripheral surface of the second body portion 21C.

It should be noted that the method of fixing the inserted portion 221 to the tubular body 21 is not limited to press fitting, but may be welding, crimping, or the like.

As illustrated in FIG. 2, the pitch conversion unit 4 includes a board portion 41, a protruding portion 42, and a solder resist 43. The board portion 41 includes a ceramic layer 411 and a thin film layer 412. The configuration of the pitch conversion unit 4 is not limited to that described above. For example, the pitch conversion unit 4 may be made up of a multilayer circuit board such as a multi-layer organic (MLO) circuit board or a multi-layer ceramic (MLC) circuit board. In addition, the pitch conversion unit 4 does not necessarily include the solder resist 43.

The ceramic layer 411 has a plurality of through holes 411A bored through the ceramic layer 411 from an upper surface to a lower surface of the ceramic layer 411. The through holes 411A are arranged in a matrix form as seen from above. The through holes 411A are each filled with a conductor such as silver. Upper end surfaces of the conductors in the through holes 411A serve as the electrodes 4C.

The solder resist 43 is formed on an upper end surface of the ceramic layer 411 to prevent contact of the solder balls SB with irrelevant portions other than the electrodes 4C.

The thin film layer 412 is disposed on a lower surface of the ceramic layer 411. The thin film layer 412 includes a first via layer 412A, a first wiring pattern layer 412B, a second via layer 412C, and a second wiring pattern layer 412D. The first via layer 412A, the first wiring pattern layer 412B, the second via layer 412C, and the second wiring pattern layer 412D are stacked in this order.

The first via layer 412A has vias (through holes) extending upward from a lower surface of the thin film layer 412, and the vias are filled with a conductor such as copper. The lower surface of the thin film layer 412 corresponds to a surface 41A of the board portion 41. The surface 41A is perpendicular to the axial direction. In other words, the pitch conversion unit 4 includes the board portion 41 that has the surface 41A perpendicular to the axial direction.

The first wiring pattern layer 412B has a wiring pattern connected to upper ends of the vias in the first via layer 412A. The wiring pattern is made of a conductor such as copper.

The second via layer 412C has vias connecting the wiring pattern of the first wiring pattern layer 412B and a wiring pattern of the second wiring pattern layer 412D, and the vias are filled with a conductor such as copper.

The wiring pattern of the second wiring pattern layer 412D is made of a conductor such as copper. The wiring pattern is connected to lower end surfaces of the conductors in the through holes 411A at an upper end of the thin film layer 412.

The protruding portion 42 protrudes downward from the surface 41A. The protruding portion 42 is made of, for example, a conductor such as nickel, copper, or gold. For example, the protruding portion 42 is formed by axial lamination using MEMS technology.

In this embodiment, multiple protruding portions 42 are arranged in a matrix form as seen from below, and are connected to the conductors in the vias in the first via layer 412A at the surface 41A. The protruding portions 42 make up the lower end portion 4A of the pitch conversion unit 4. In addition, the wiring portion 4B is made up of the conductor in the thin film layer 412 and the conductor in the ceramic layer 411 connected to the conductor in the thin film layer 412.

The support member 3 includes an upper support body 31, a middle support body 32, and a lower support body 33. The lower support body 33 has support holes 33A as through holes bored through the lower support body 33 in the axial direction. Each support hole 33A has an inside diameter that is slightly larger than an outside diameter of the corresponding contact portion 222B and is smaller than an outside diameter of the corresponding flange portion 222A. This configuration allows the contact portion 222B to be inserted into the support hole 33A and allows the flange portion 222A to prevent falling of the contact terminal 2.

The middle support body 32 is located above the lower support body 33, and has support holes 32A as through holes coaxial with the support holes 33A. Each support hole 32A has an inside diameter that is slightly larger than an outside diameter of the corresponding tubular body 21. The upper support body 31 is located above the middle support body 32, and has support holes 31A as through holes coaxial with the support holes 32A. Each support hole 31A has an inside diameter that is slightly larger than the outside diameter of the corresponding tubular body 21. This configuration allows the tubular body 21 to be inserted into the support holes 32A and 31A.

In supporting each contact terminal 2 with the support member 3, the contact portion 222B is inserted from above into the support hole 31A, the support hole 32A, and the support hole 33A in this order. The support holes 31A and 32A each have a section that allows the flange portion 222A to be inserted therethrough as seen in the axial direction.

Alternatively, the support member 3 may be disassembled into the upper support body 31, the middle support body 32, and the lower support body 33. First, the contact portion 222B is inserted into the lower support body 33. Next, the middle support body 32 is fixed to the lower support body 33, while the tubular body 21 is inserted into the middle support body 32. Next, the upper support body 31 is fixed to the middle support body 32, while the tubular body 21 is inserted into the upper support body 31.

In the state in which each contact terminal 2 and the support member 3 are assembled into the probe head 1, the contact portion 222B is inserted in the support hole 33A, and the flange portion 222A is in contact with the upper surface of the lower support body 33. Moreover, the third body portion 21E is inserted in the support hole 32A, and the second body portion 21C is inserted in the support hole 31A. Each contact terminal 2 is thus supported by the support member 3.

In mounting the probe head 1 in the state described above to the pitch conversion unit 4, the support member 3 is fixed to the pitch conversion unit 4, while the second body portion 21C of each contact terminal 2 is fitted to the protruding portion 42. In the state in which the probe head 1 is mounted to the pitch conversion unit 4, the first spring portion 21B and the second spring portion 21D may be in a natural length state or may be in a compressed state.

The second body portion 21C is fitted to the protruding portion 42, so that the contact terminal 2 is electrically connected to the protruding portion 42. Therefore, the contact terminal 2 is brought into electrical conduction with the corresponding electrode 4C via the protruding portion 42 and the wiring portion 4B, and the first pitch P1 between adjacent two of the contact terminals 2 is converted into the second pitch P2 between adjacent two of the electrodes 4C.

In other words, the pitch conversion unit 4 includes the protruding portions 42 each of which protrudes from the surface 41A toward the first side X1 in the axial direction, is electrically conductive, and is fitted to the second axial end portion 212 of the corresponding tubular body 21.

In inspecting the inspection target 20, the distal end portion 222B1 of each contact portion 222B is brought into contact with the corresponding inspection point on the inspection target 20. At this time, a force toward the second side X2 in the axial direction is applied to the distal end portion 222B1 to compress the first spring portion 21B and the second spring portion 21D. With this configuration, the distal end portion 222B1 is pressed against the inspection point by an elastic force of the first spring portion 21B and an elastic force of the second spring portion 21D, so that the distal end portion 222B1 and the inspection point are held in a stable electrically conductive and contact state. At this time, the third body portion 21E is located in the support hole 32A to suppress the buckling of the tubular body 21. The second axial end portion 221A1 of the stick-shaped main body portion 221A is located in the second body portion 21C. In addition, the second axial end portion 221A1 of the stick-shaped main body portion 221A is disposed opposite the protruding portion 42 with an axial clearance defined between the second axial end portion 221A1 and the protruding portion 42. In other words, the second axial end portion 221A1 of the stick-shaped main body portion 221A is in contact with the inner peripheral surface of the second body portion 21C.

In this state, a current path is made up of the protruding portion 42, the second body portion 21C, and the conductor 22. In other words, electrical contact points include: a contact point between the distal end portion 222B1 and the inspection point; a contact point between the second axial end portion 221A1 of the stick-shaped main body portion 221A and the second body portion 21C; and a contact point between the second body portion 21C and the protruding portion 42. Therefore, the number of contact points is three. As a result, the number of contact points is reduced. This configuration enables a reduction in contact resistance and enables a reduction in electrical resistance value of the current path.

According to this embodiment, the number of conductors (plungers) is one. Therefore, the number of required conductors is reduced as compared with a configuration of a contact terminal that requires two conductors.

Since the second axial end portion 221A1 of the inserted portion 221 is in contact with the inner peripheral surface of the second body portion 21C, the current path is made up of the protruding portion 42, the second body portion 21C, and the conductor 22. This configuration therefore enables a reduction in electrical resistance value of the current path. In addition, since the third body portion 21E is provided and the inserted portion 221 extends to the second body portion 21C, the buckling of the tubular body 21 is suppressed.

Since the second spring portion 21D and the first spring portion 21B are wound in opposite directions, the rotation of the tubular body 21 is suppressed even when the conductor 22 is brought into contact with the inspection target 20 to compress the first spring portion 21B and the second spring portion 21D. This configuration therefore reduces a load to be applied to the protruding portion 42.

Figure 4:
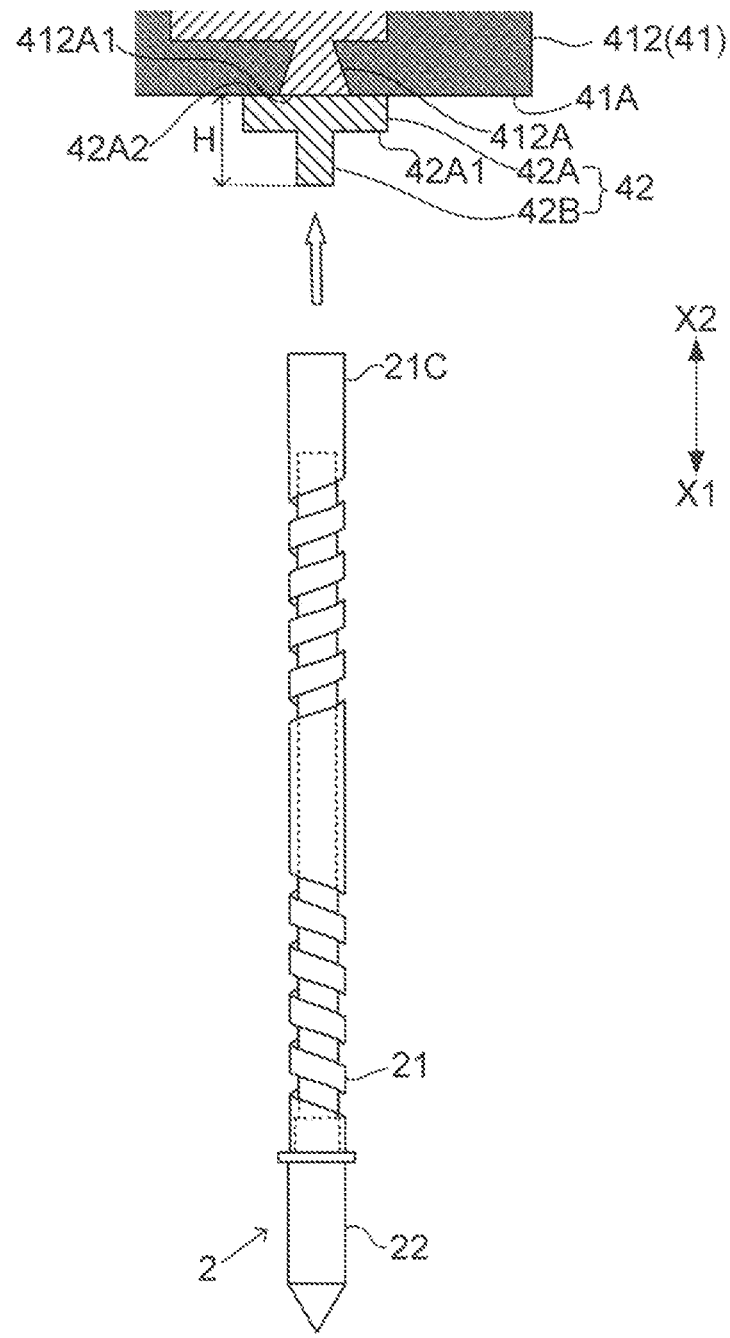
FIG. 4 is a diagram that illustrates how to fit a contact terminal to a protruding portion according to a first example.
Figure 5:
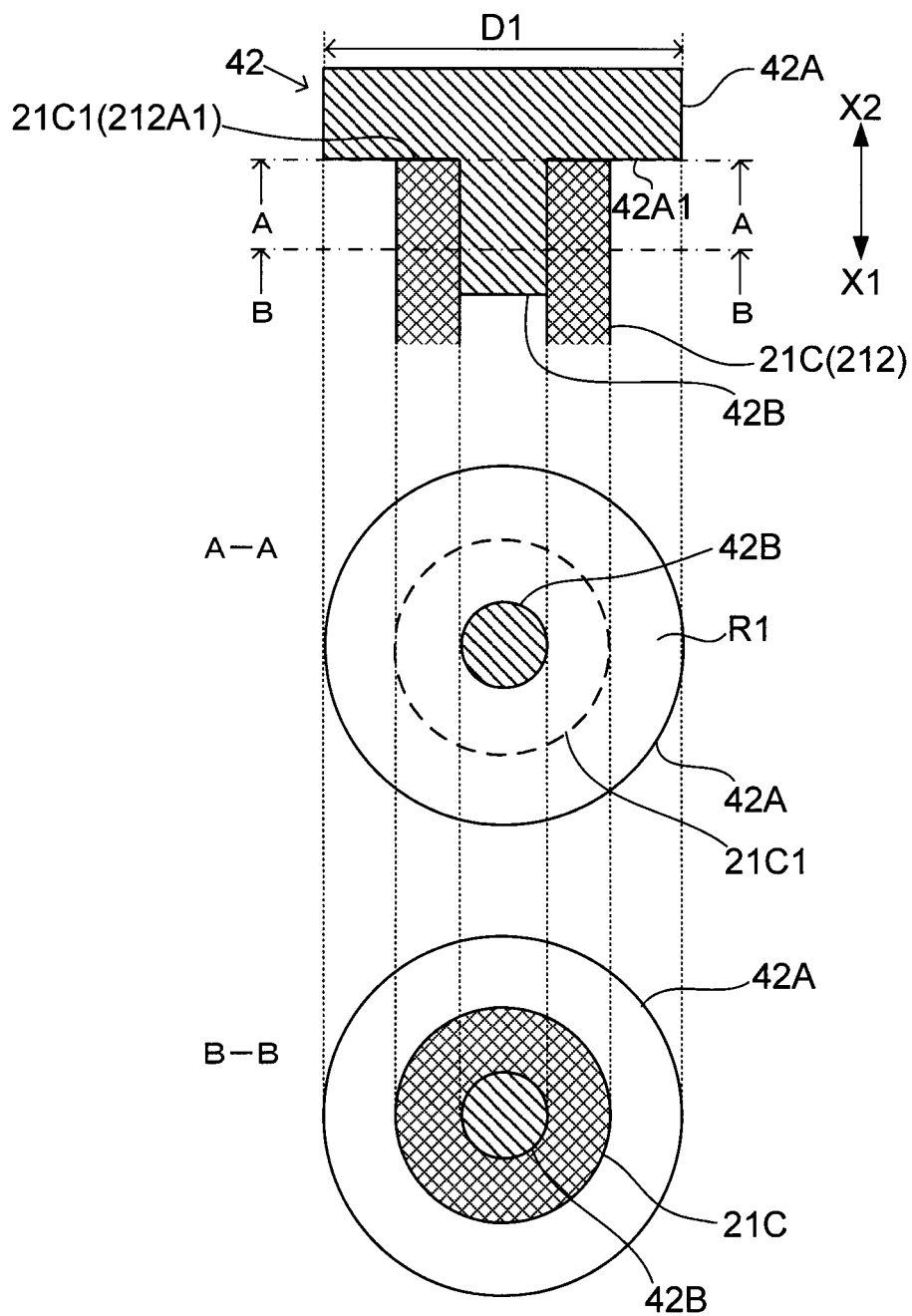
FIG. 5 is a diagram that includes a partial sectional view illustrating a state in which a tubular body is fitted to the protruding portion according to the first example, a sectional view taken along line A-A in the partial sectional view, and a sectional view taken along line B-B in the partial sectional view.

Next, a description will be given of a protruding portion 42 according to an example. FIG. 4 illustrates how to fit a contact terminal 2 to a protruding portion 42 according to a first example. In FIG. 4, a board portion 41 and the protruding portion 42 are illustrated in the form of a sectional view. FIG. 5 is a diagram that includes a partial sectional view illustrating a state in which a second body portion 21C (a tubular body 21) is fitted to the protruding portion 42, a sectional view taken along line A-A in the partial sectional view, and a sectional view taken along line B-B in the partial sectional view. It should be noted that the protruding portion 42 illustrated in FIG. 2 is similar in configuration to the protruding portion 42 illustrated in FIG. 4. In the first example, the tubular body 21 has a cylindrical shape.

The board portion 41 (a thin film layer 412) has a via 412A bored through the board portion 41 in the axial direction. The via 412A extends inward from a surface 41A of the board portion 41, and is filled with a conductor. In other words, the board portion 41 has the via 412A. The via 412A has a first axial end surface 412A1 located on the surface 41A.

The protruding portion 42 includes an electrode portion (a pad) 42A and a pin 42B. In other words, the protruding portion 42 includes at least the pin 42B of the electrode portion 42A and the pin 42B.

The electrode portion 42A protrudes from the surface 41A toward the first side X1 in the axial direction and has a columnar shape. The electrode portion 42A covers an end surface of the conductor exposed to the surface 41A, from the first side X1 in the axial direction such that the electrode portion 42A is connected to the conductor in the via 412A. In other words, the electrode portion 42A is disposed on the surface 41A of the board portion 41. In addition, the electrode portion 42A has a second axial end surface 42A2 contiguous with the first axial end surface 412A1 of the via 412A.

The electrode portion 42A has a circular area as seen in the axial direction. This circular area is larger than a circular area of the end surface of the conductor in the via 412A, the end surface being exposed to the surface 41A. In other words, the second axial end surface 42A2 of the electrode portion 42A is larger in area than the first axial end surface 412A1 of the via 412A.

The pin 42B protrudes from a first axial end surface 42A1 of the electrode portion 42A toward the first side X1 in the axial direction, and has a columnar shape coaxial with the electrode portion 42A.

In FIG. 5, line A-A indicates a position of the first axial end surface 42A1 of the electrode portion 42A.

In the A-A sectional view of FIG. 5, a circular ring-shaped region R1 surrounded by an outer edge of the electrode portion 42A and an outer edge of the pin 42B is a portion where the first axial end surface 42A1 of the electrode portion 42A does not overlap the pin 42B as seen in the axial direction. With this configuration, at an outer edge position (indicated by a broken line) of an end surface 21C1 of the second body portion 21C illustrated in the A-A sectional view, a second axial end portion 212 (the second body portion 21C) of the tubular body 21 is fitted to the pin 42B, so that a second axial end surface 212A1 (the end surface 21C1) of the tubular body 21 is brought into contact with the electrode portion 42A. This configuration thus enables a reduction in electrical resistance value of a current path.

In addition, at the outer edge position (indicated by the broken line) of the end surface 21C1 illustrated in the A-A sectional view, the second axial end surface 212A1 (the end surface 21C1) of the tubular body 21 entirely overlaps the first axial end surface 42A1 of the electrode portion 42A as seen in the axial direction. This configuration enables an increase in contact area between the second axial end surface 212A1 of the tubular body 21 and the electrode portion 42A and enables a further reduction in resistance value of the current path.

In FIG. 5, line B-B indicates a midway position of a contact place between the second body portion 21C and the pin 42B in the axial direction. As illustrated in the B-B sectional view of FIG. 5, the pin 42B has an outer peripheral shape that is similar to the circular inner peripheral shape of the second body portion 21C as seen in sectional view of the contact place between the pin 42B and the second body portion 21C in the axial direction. In other words, the protruding portion 42 has the outer peripheral shape similar to the inner peripheral shape of the tubular body 21 as seen in sectional view of the contact place between the protruding portion 42 and the tubular body 21 in the axial direction. This configuration enables an increase in contact area between the protruding portion 42 and the tubular body 21 and enables a further reduction in electrical resistance value of the current path.

Particularly in a case of employing a configuration in which the pin 42B is not provided and the second axial end surface 212A1 of the tubular body 21 is brought into contact with the planar first axial end surface 42A1 of the electrode portion 42A, it is difficult to bring the electrode portion 42A into contact with the inner peripheral surface of the tubular body 21. As a result, a contact resistance often becomes unstable. In contrast to this, according to the first example, the outer peripheral surface of the pin 42B having a columnar shape is brought into contact with the inner peripheral surface of the second body portion 21C (the tubular body 21) with ease. This configuration enables stabilization of a contact resistance. For example, in a case where a gold plating layer is formed on the inner peripheral surface of the tubular body 21, the outer peripheral surface of the pin 42B may be brought into contact with the gold plating layer. This configuration produces an advantageous effect of improving the electrical resistance value of the current path.

Figure 6:
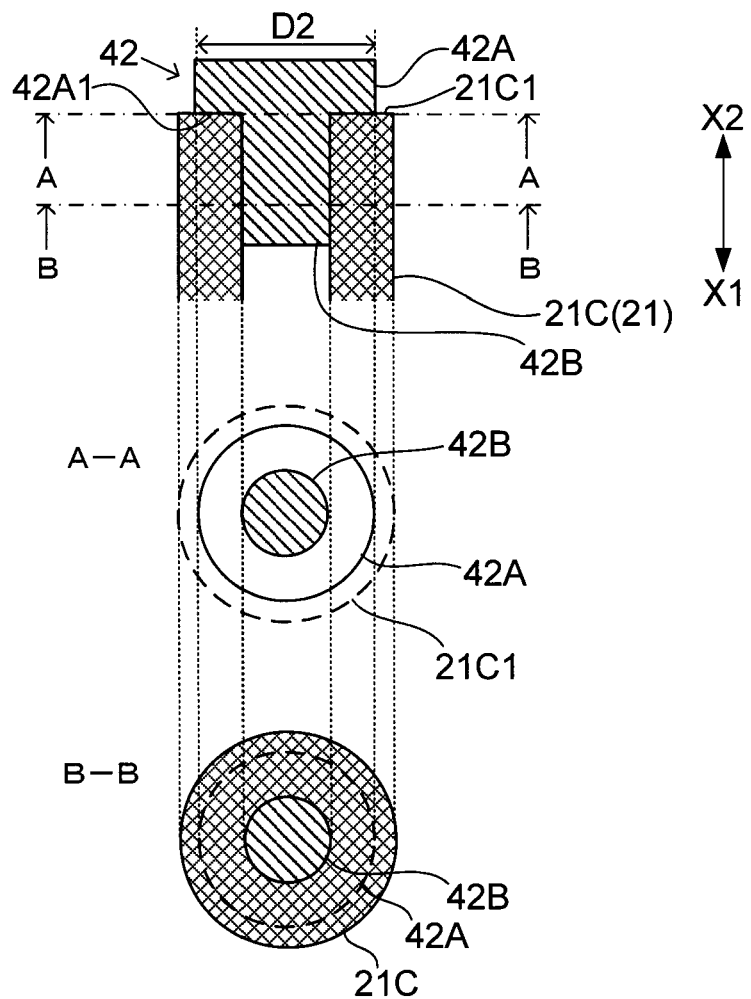
FIG. 6 is a diagram that illustrates a modification of the configuration illustrated in FIG. 5.

FIG. 6 is a diagram that includes a sectional view of a protruding portion 42 according to a modification of the first example illustrated in FIG. 5. The diagram of FIG. 6 includes an A-A sectional view and a B-B sectional view as in FIG. 5.

In the protruding portion 42 illustrated in FIG. 6, an outside diameter D2 of an electrode portion 42A is smaller than an outside diameter D1 of the electrode portion 42A illustrated in FIG. 5. As illustrated in the A-A sectional view of FIG. 6, therefore, a first axial end surface 42A1 of the electrode portion 42A does not partially overlap a pin 42B as seen in the axial direction. At an outer edge position (indicated by a broken line) of an end surface 21C1 of a second body portion 21C illustrated in the A-A sectional view, a part of the end surface 21C1 is in contact with the first axial end surface 42A1 of the electrode portion 42A. This configuration also produces an advantageous effect of improving an electrical resistance value of a current path.

Figure 7:
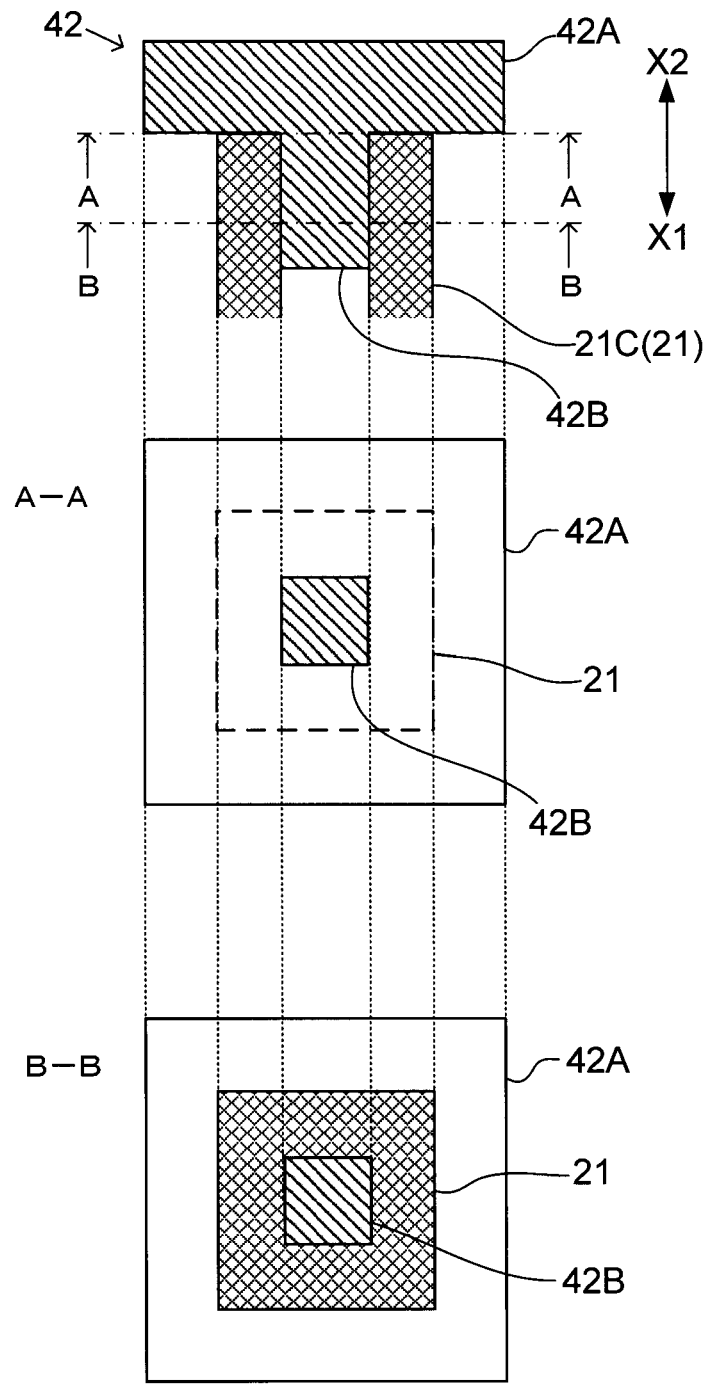
FIG. 7 is a diagram that includes a partial sectional view illustrating a state in which a tubular body is fitted to a protruding portion according to a second example, a sectional view taken along line A-A in the partial sectional view, and a sectional view taken along line B-B in the partial sectional view.

FIG. 7 is a diagram that includes a sectional view of a protruding portion 42 according to a second example. FIG. 7 has a correspondence to FIG. 5. The diagram of FIG. 7 includes an A-A sectional view and a B-B sectional view as in FIG. 5.

As illustrated in FIG. 7, according to the second example, a tubular body 21 has a square annular tubular shape as seen in sectional view in the axial direction. Correspondingly, the protruding portion 42 includes an electrode portion 42A and a pin 42B each of which has a square prism shape as seen in sectional view in the axial direction. The second example also produces an advantageous effect similar to that in the first example. As illustrated in the B-B sectional view of FIG. 7, particularly, the pin 42B has an outer peripheral shape that is similar to a square inner peripheral shape of the tubular body 21 at a contact place between the pin 42B and the tubular body 21 as seen in sectional view in the axial direction.

Figure 8:
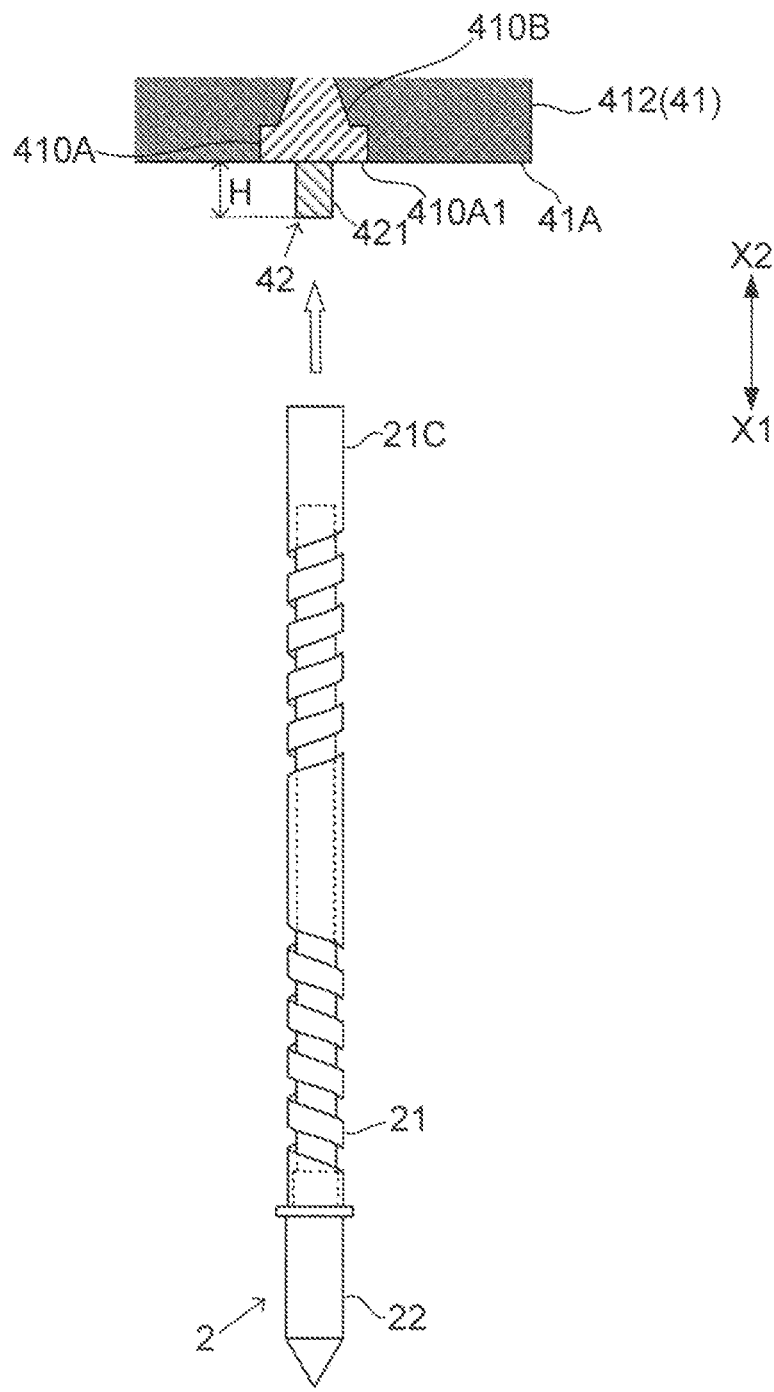
FIG. 8 is a diagram that illustrates how to fit a contact terminal to a protruding portion according to a third example.

FIG. 8 is a diagram that illustrates how to fit a contact terminal 2 to a protruding portion 42 according to a third example. FIG. 8 has a correspondence to FIG. 4.

As illustrated in FIG. 8, a board portion 41 (a thin film layer 412) has a via 410B. The via 410B is filled with a conductor. The board portion 41 includes an electrode portion 410A serving as a pad connected to a first axial end surface of the conductor in the via 410B. The electrode portion 410A is larger in area than the first axial end surface of the via 410B as seen in sectional view in the axial direction. The electrode portion 410A has a first axial end surface 410A1 located on a surface 41A of the board portion 41. In other words, the electrode portion 410A is disposed in the board portion 41.

A pin 421 serves as the protruding portion 42. The pin 421 protrudes from the first axial end surface 410A1 of the electrode portion 410A toward the first side X1 in the axial direction. The pin 421 has, for example, a columnar shape or a quadrilateral prism shape. In accordance with the shape of the pin 421, a tubular body 21 has, for example, a cylindrical shape or a quadrilateral annular tubular shape as seen in sectional view in the axial direction.

The electrode portion 410A and the pin 421 according to the third example respectively correspond to the electrode portion 42A and the pin 42B according to the first example (FIGS. 4 to 6) or the second example (FIG. 7). Therefore, the third example also produces an advantageous effect similar to that in the first example or the second example.

Figure 9:
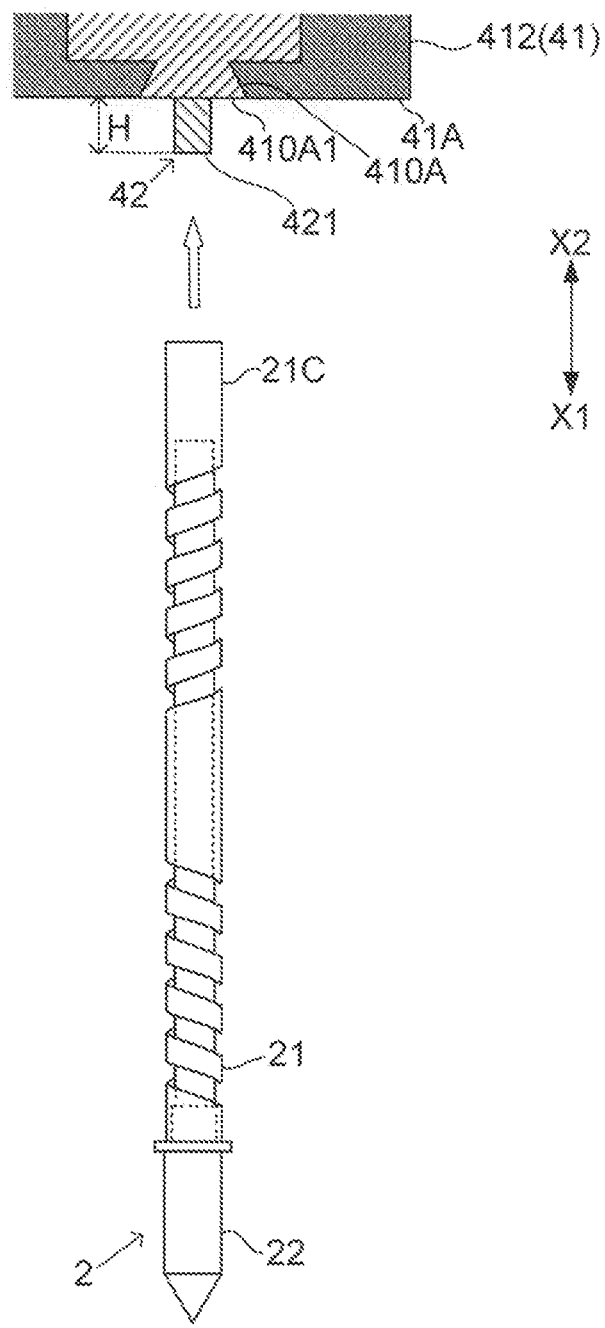
FIG. 9 is a diagram that illustrates a modification of the third example illustrated in FIG. 8.

FIG. 9 is a diagram that illustrates a modification of the third example illustrated in FIG. 8. A configuration illustrated in FIG. 9 is different from the configuration illustrated in FIG. 8 in that a via is used as an electrode portion 410A. The configuration illustrated FIG. 9 produces an advantageous effect similar to that produced by the configuration illustrated in FIG. 8.

Figure 10:
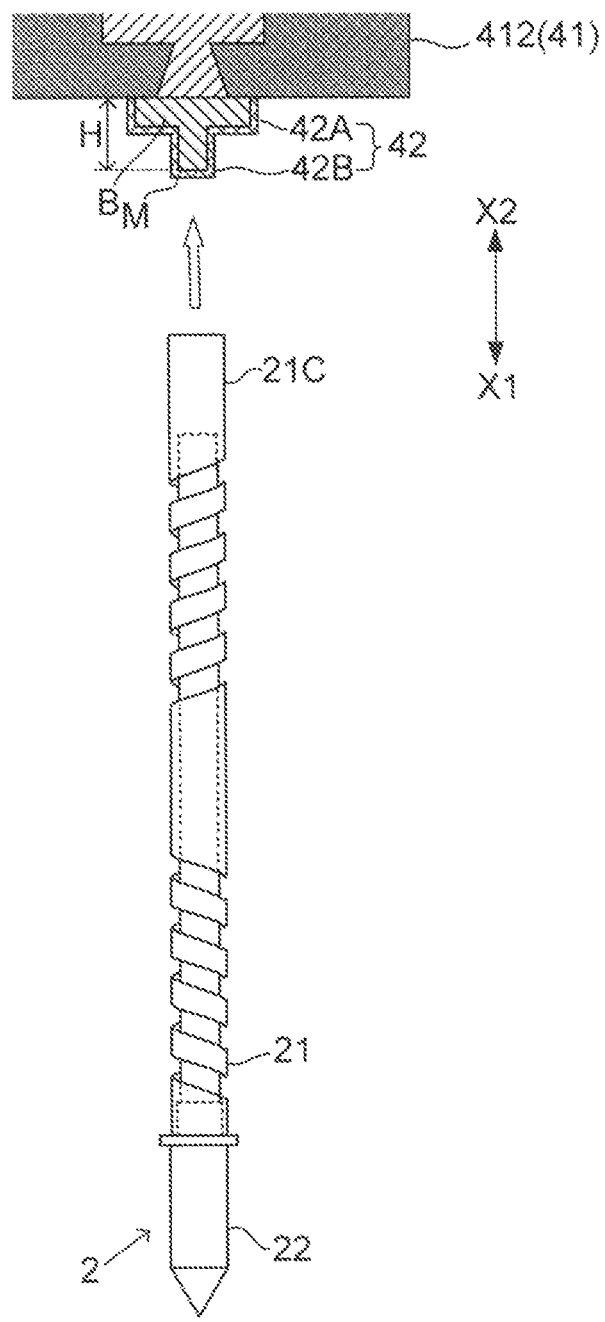
FIG. 10 is a diagram that illustrates a modification of the protruding portion illustrated in FIG. 4.

FIG. 10 illustrates a modification of the protruding portion 42 illustrated in FIG. 4. The protruding portion 42 illustrated in FIG. 10 includes a base portion B and a plating layer M. For example, the base portion B is formed from copper or the like by axial lamination using MEMS technology, and a surface of the base portion B thus formed is covered with the plating layer M such as a gold plating layer. The base portion B is made of a material having a relatively low electrical resistance value. With this configuration, the plating layer M suppresses oxidation of the base portion B.

The configuration using the plating layer is applicable to the protruding portion 42 illustrated in FIG. 8 and the protruding portion 42 illustrated in FIG. 9, in addition to the protruding portion 42 illustrated in FIG. 4.

FIG. 3 is an exploded perspective view that illustrates a configuration in a case where the tubular body 21 is fixed by press fitting to the protruding portion 42. In FIG. 3, the protruding portion 42 has a configuration corresponding to a configuration including the electrode portion 42A and the pin 42B illustrated in FIG. 3. It should be noted that the pin 42B illustrated in FIG. 3 may correspond to the pin 421 illustrated in FIG. 8 or 9.

As illustrated FIG. 3, the second body portion 21C of the tubular body 21 has a slit S2 extending in the axial direction. The slit S2 is formed in the peripheral surface of the second axial end portion 212. In other words, the tubular body 21 has the slit S2 in the peripheral surface of the second axial end portion 212 of the tubular body 21, the slit S2 extending in the axial direction.

The pin 42B includes a base portion 42B1 and a contiguous portion 42B2. The base portion 42B1 has a columnar shape extending in the axial direction. The contiguous portion 42B2 is contiguous with the base portion 42B1 on the first side X1 in the axial direction. The contiguous portion 42B2 has a truncated cone shape. The contiguous portion 42B2 has an outside diameter that is gradually smaller than an outside diameter of the base portion 42B1 as the contiguous portion 42B2 is closer to the first side X1 in the axial direction. The shapes of the base portion 42B1 and contiguous portion 42B2 are not limited to those described above. For example, the base portion 42B1 may have a quadrilateral prism shape, and the contiguous portion 42B2 may have a quadrilateral frustum shape.

In other words, the pin 42B includes: the base portion 42B1 that has a fixed area in the axial direction as seen in sectional view in the axial direction; and the contiguous portion 42B2 that is contiguous with the first axial end surface 42B1S of the base portion 42B1 and has an area gradually decreasing toward the first side X1 in the axial direction as seen in sectional view in the axial direction.

In a state before the tubular body 21 is fixed to the protruding portion 42, the outside diameter of the base portion 42B1 is larger than the inside diameter of the tubular body 21 (the second body portion 21C). In fixing the tubular body 21 to the protruding portion 42, an inner edge of the end surface 21C1 of the second body portion 21C is brought into contact with the outer peripheral surface of the contiguous portion 42B2. Since the contiguous portion 42B2 is provided, the pin 42B is inserted into the tubular body 21 with ease. When the tubular body 21 is pushed, the slit S2 expands the tubular body 21, so that the second body portion 21C is pushed depthwise until the second body portion 21C comes into contact with the electrode portion 42A. This configuration suppresses variations in position where the second body portion 21C is fixed. The inner peripheral surface of the second body portion 21C is brought into contact with the outer peripheral surface of the base portion 42B1. This configuration therefore secures a large contact area between the tubular body 21 and the protruding portion 42.

In the case of forming the protruding portion 42 illustrated in FIG. 4, 8, 9, or 10, as a height H of the protruding portion 42 is higher, a contact area between the inner peripheral surface of the second body portion 21C and the protruding portion 42 is larger. This configuration stabilizes a contact resistance between the electrode portion 42A or 410A and the tubular body 21 with ease, so that the tubular body 21 is less prone to be displaced in a direction perpendicular to the axial direction. The height H of the protruding portion 42 is, for example, 50 µm or less.

While embodiments of the present disclosure have been described above, various modifications may be made on the embodiments without departing from the scope of the present disclosure.

The present disclosure is applicable to electrical inspections for various inspection targets.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An inspection jig comprising:
   contact terminals; and
   a pitch conversion unit electrically connected to the contact terminals and configured to convert a first pitch between adjacent two of the contact terminals into a second pitch different from the first pitch,
   wherein
   the contact terminals each include:
      a tubular body that extends in an axial direction of the contact terminal and is electrically conductive; and
      a conductor that is electrically conductive and has a stick shape,
   the tubular body includes a spring portion that has a helical shape along a peripheral surface of the tubular body,
   the conductor includes:
      an uninserted portion that protrudes from the tubular body toward a first side in the axial direction; and
      an inserted portion that is disposed in the tubular body and is fixed to a first axial end portion of the tubular body, and the pitch conversion unit includes:
      a board portion that has a surface perpendicular to the axial direction; and
      a protruding portion that protrudes from the surface toward the first side in the axial direction, is electrically conductive, and is fitted to a second axial end portion of the tubular body.

2. The inspection jig according to claim 1, wherein
   the protruding portion includes at least a pin of an electrode portion and the pin,
   the electrode portion is disposed on the surface of the board portion or is disposed in the board portion,
   the pin protrudes from the electrode portion toward the first side in the axial direction, and
   the electrode portion has a first axial end surface that does not partially overlap the pin as seen in the axial direction.

3. The inspection jig according to claim 2, wherein
   the tubular body has a second axial end surface that entirely overlaps the first axial end surface of the electrode portion as seen in the axial direction.

4. The inspection jig according to claim 2, wherein
   the protruding portion includes the electrode portion,
   the board portion has a via,
   the via has a first axial end surface located on the surface of the board portion,
   the electrode portion has a second axial end surface that is contiguous with the first axial end surface of the via,
   the second axial end surface of the electrode portion is larger in area than the first axial end surface of the via, and
   the pin protrudes from the first axial end surface of the electrode portion toward the first side in the axial direction.

5. The inspection jig according to claim 2, wherein
   the electrode portion is disposed in the board portion,
   the first axial end surface of the electrode portion is located on the surface of the board portion, and
   the pin protrudes from the first axial end surface of the electrode portion toward the first side in the axial direction.

6. The inspection jig according to claim 1, wherein
   the protruding portion has an outer peripheral shape similar to an inner peripheral shape of the tubular body as seen in sectional view of a contact place between the protruding portion and the tubular body in the axial direction.

7. The inspection jig according to claim 1, wherein
   the protruding portion includes at least a pin of an electrode portion and the pin,
   the electrode portion is disposed on the surface of the board portion or is disposed in the board portion,
   the pin protrudes from the electrode portion toward the first side in the axial direction,
   the tubular body has a slit in a peripheral surface of the second axial end portion of the tubular body, the slit extending in the axial direction, and
   the pin includes:
      a base portion having a fixed area in the axial direction as seen in sectional view in the axial direction; and
      a contiguous portion that is contiguous with a first axial end surface of the base portion and has an area gradually decreasing toward the first side in the axial direction as seen in sectional view in the axial direction.

8. The inspection jig according to claim 1, wherein
the spring portion includes:
a first spring portion; and
a second spring portion that is disposed on the first spring portion on a second side in the axial direction,
the tubular body includes:
a first body portion that is disposed between the first spring portion and the second spring portion and has no helical groove; and
a second body portion that is disposed on the second axial end portion of the tubular body and has no helical groove, and
the inserted portion has a second axial end portion that is in contact with an inner peripheral surface of the second body portion.

9. The inspection jig according to claim 8, wherein
the second spring portion and the first spring portion are wound in opposite directions.

10. The inspection jig according to claim 3, wherein
the protruding portion includes the electrode portion,
the board portion has a via,
the via has a first axial end surface located on the surface of the board portion,
the electrode portion has a second axial end surface that is contiguous with the first axial end surface of the via,
the second axial end surface of the electrode portion is larger in area than the first axial end surface of the via, and
the pin protrudes from the first axial end surface of the electrode portion toward the first side in the axial direction.

11. The inspection jig according to claim 3, wherein
the electrode portion is disposed in the board portion,
the first axial end surface of the electrode portion is located on the surface of the board portion, and
the pin protrudes from the first axial end surface of the electrode portion toward the first side in the axial direction.

12. The inspection jig according to claim 2, wherein
the protruding portion has an outer peripheral shape similar to an inner peripheral shape of the tubular body as seen in sectional view of a contact place between the protruding portion and the tubular body in the axial direction.

13. The inspection jig according to claim 3, wherein
the protruding portion has an outer peripheral shape similar to an inner peripheral shape of the tubular body as seen in sectional view of a contact place between the protruding portion and the tubular body in the axial direction.

14. The inspection jig according to claim 4, wherein
the protruding portion has an outer peripheral shape similar to an inner peripheral shape of the tubular body as seen in sectional view of a contact place between the protruding portion and the tubular body in the axial direction.

15. The inspection jig according to claim 5, wherein
the protruding portion has an outer peripheral shape similar to an inner peripheral shape of the tubular body as seen in sectional view of a contact place between the protruding portion and the tubular body in the axial direction.

16. The inspection jig according to claim 2, wherein
the protruding portion includes at least a pin of an electrode portion and the pin,
the electrode portion is disposed on the surface of the board portion or is disposed in the board portion,
the pin protrudes from the electrode portion toward the first side in the axial direction,
the tubular body has a slit in a peripheral surface of the second axial end portion of the tubular body, the slit extending in the axial direction, and
the pin includes:
a base portion having a fixed area in the axial direction as seen in sectional view in the axial direction; and
a contiguous portion that is contiguous with a first axial end surface of the base portion and has an area gradually decreasing toward the first side in the axial direction as seen in sectional view in the axial direction.

17. The inspection jig according to claim 3, wherein
the protruding portion includes at least a pin of an electrode portion and the pin,
the electrode portion is disposed on the surface of the board portion or is disposed in the board portion,
the pin protrudes from the electrode portion toward the first side in the axial direction,
the tubular body has a slit in a peripheral surface of the second axial end portion of the tubular body, the slit extending in the axial direction, and
the pin includes:
a base portion having a fixed area in the axial direction as seen in sectional view in the axial direction; and
a contiguous portion that is contiguous with a first axial end surface of the base portion and has an area gradually decreasing toward the first side in the axial direction as seen in sectional view in the axial direction.

18. The inspection jig according to claim 4, wherein
the protruding portion includes at least a pin of an electrode portion and the pin,
the electrode portion is disposed on the surface of the board portion or is disposed in the board portion,
the pin protrudes from the electrode portion toward the first side in the axial direction,
the tubular body has a slit in a peripheral surface of the second axial end portion of the tubular body, the slit extending in the axial direction, and
the pin includes:
a base portion having a fixed area in the axial direction as seen in sectional view in the axial direction; and
a contiguous portion that is contiguous with a first axial end surface of the base portion and has an area gradually decreasing toward the first side in the axial direction as seen in sectional view in the axial direction.

19. The inspection jig according to claim 5, wherein
the protruding portion includes at least a pin of an electrode portion and the pin,
the electrode portion is disposed on the surface of the board portion or is disposed in the board portion,
the pin protrudes from the electrode portion toward the first side in the axial direction,
the tubular body has a slit in a peripheral surface of the second axial end portion of the tubular body, the slit extending in the axial direction, and
the pin includes:
a base portion having a fixed area in the axial direction as seen in sectional view in the axial direction; and
a contiguous portion that is contiguous with a first axial end surface of the base portion and has an area gradually decreasing toward the first side in the axial direction as seen in sectional view in the axial direction.

20. The inspection jig according to claim 6, wherein
the protruding portion includes at least a pin of an electrode portion and the pin,
the electrode portion is disposed on the surface of the board portion or is disposed in the board portion,
the pin protrudes from the electrode portion toward the first side in the axial direction,
the tubular body has a slit in a peripheral surface of the second axial end portion of the tubular body, the slit extending in the axial direction, and
the pin includes:
- a base portion having a fixed area in the axial direction as seen in sectional view in the axial direction; and
- a contiguous portion that is contiguous with a first axial end surface of the base portion and has an area gradually decreasing toward the first side in the axial direction as seen in sectional view in the axial direction.

\* \* \* \* \*